United States Patent
Park et al.

(10) Patent No.: US 7,961,837 B2
(45) Date of Patent: Jun. 14, 2011

(54) COUNTER CIRCUIT AND METHOD OF OPERATING THE SAME

(75) Inventors: Jae-Boum Park, Gyeonggi-do (KR); Young-Bo Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/605,532

(22) Filed: Oct. 26, 2009

(65) Prior Publication Data

US 2010/0046694 A1 Feb. 25, 2010

Related U.S. Application Data

(62) Division of application No. 11/819,863, filed on Jun. 29, 2007, now Pat. No. 7,609,801.

(30) Foreign Application Priority Data

Aug. 11, 2006 (KR) .................. 10-2006-0076123

(51) Int. Cl.
*G06M 3/00* (2006.01)

(52) U.S. Cl. ................ 377/52; 377/118; 377/119

(58) Field of Classification Search .................. None
See application file for complete search history.

(56) References Cited

U.S. PATENT DOCUMENTS

| | | | |
|---|---|---|---|
| 3,599,012 A * | 8/1971 | Green | .................. 377/115 |
| 5,787,045 A | 7/1998 | Lee | |
| 6,215,837 B1 | 4/2001 | Yi | |
| 6,912,169 B2 | 6/2005 | Choi | |
| 7,224,625 B2 | 5/2007 | Dietrich et al. | |

FOREIGN PATENT DOCUMENTS

| | | |
|---|---|---|
| JP | 8018440 | 1/1996 |
| JP | 2003163591 | 6/2003 |
| JP | 2004222212 | 8/2004 |
| KR | 1019990075209 | 10/1999 |
| KR | 1020030078126 | 10/2003 |

* cited by examiner

*Primary Examiner* — Tuan Lam

(74) *Attorney, Agent, or Firm* — Venable LLP; Jeffri A. Kaminski

(57) ABSTRACT

A control unit that outputs a plurality of control signals in response to the input of a plurality of counter enable signals allocated into the numerical value of a multiple of 2 is provided. An operating unit increments or decrements by a multiple of 2 in response to input of the plurality of control signals and count up-down signals.

3 Claims, 4 Drawing Sheets

| | | | | | | | | | |
|---|---|---|---|---|---|---|---|---|---|
| D<0> | 0 | 1 | 0 | 1 | 0 | 1 | 0 | 1 | 0 |
| D<1> | 0 | 0 | 1 | 1 | 0 | 0 | 1 | 1 | 0 |
| D<2> | 0 | 0 | 0 | 0 | 1 | 1 | 1 | 1 | 0 |
| D<3> | 0 | 0 | 0 | 0 | 0 | 0 | 0 | 0 | 1 |

*2

| | | | | | | | | | |
|---|---|---|---|---|---|---|---|---|---|
| D<0> | 0 | 0 | 0 | 0 | 0 | 0 | 0 | 0 | 0 |
| D<1> | 0 | 1 | 0 | 1 | 0 | 1 | 0 | 1 | 0 |
| D<2> | 0 | 0 | 1 | 1 | 0 | 0 | 1 | 1 | 0 |
| D<3> | 0 | 0 | 0 | 0 | 1 | 1 | 1 | 1 | 0 |

*4

| | | | | | | | | | |
|---|---|---|---|---|---|---|---|---|---|
| D<0> | 0 | 0 | 0 | 0 | 0 | 0 | 0 | 0 | 0 |
| D<1> | 0 | 0 | 0 | 0 | 0 | 0 | 0 | 0 | 0 |
| D<2> | 0 | 1 | 0 | 1 | 0 | 1 | 0 | 1 | 0 |
| D<3> | 0 | 0 | 1 | 1 | 0 | 0 | 1 | 1 | 0 |

*8

| | | | | | | | | | |
|---|---|---|---|---|---|---|---|---|---|
| D<0> | 0 | 0 | 0 | 0 | 0 | 0 | 0 | 0 | 0 |
| D<1> | 0 | 0 | 0 | 0 | 0 | 0 | 0 | 0 | 0 |
| D<2> | 0 | 0 | 0 | 0 | 0 | 0 | 0 | 0 | 0 |
| D<3> | 0 | 1 | 0 | 1 | 0 | 1 | 0 | 1 | 0 |

US 7,961,837 B2

COUNTER CIRCUIT AND METHOD OF OPERATING THE SAME

CROSS-REFERENCE TO RELATED PATENT APPLICATION

This application is a divisional of U.S. patent application Ser. No. 11/819,863, filed Jun. 29, 2007, now U.S. Pat. No. 7,609,801, the subject matter of which application is incorporated herein by reference in its entirety.

This application claims the benefit of Korean Patent Application No. 10-2006-0076123, filed on Aug. 11, 2006, in the Korean Intellectual Property Office, the disclosure of which is incorporated herein in its entirety by reference.

BACKGROUND OF THE INVENTION

1. Technical Field

The present invention relates to a semiconductor operating apparatus, and in particular, to a counter circuit and a method of operating the same.

2. Related Art

Generally, a conventional counter circuit is configured by a plurality of flip-flops that operate in accordance with an input of a clock to perform a counting up or a counting down operation. A counting up-down signal is input to each of the flip-flops, and the counting up or down operation is determined on the basis of the level of the input add or subtract signal. When such flip-flops perform the counting up or down operation, a carry is produced and then supplied to a next flip-flop.

However, the conventional counter circuit performs an operation (counting up or down operation) by 1. Specifically, the conventional counter circuit according to the related art can only perform an operation that increments or decrements by a decimal number of 1 to or from a number that is previously stored. Accordingly, when the counter circuit repeatedly increments or decrements by a relatively large number, it takes a large amount of time to perform the operation with the numerical value of 1, which reduces the time efficiency.

Moreover, the counter circuit according to the related art can not perform the operation with the numerical value of 2, that is, it is impossible to increment or decrement by 2 or larger to or from the number that is previously stored. Therefore, it is difficult to effectively perform operations and the operation time is undesirably increased.

SUMMARY OF THE INVENTION

Embodiments of the present invention provide a counter circuit that is capable of reducing the operation time.

Embodiments of the present invention also provide a counter circuit that is capable of performing an operation with a numerical value of 2.

Embodiments of the present invention also provide a method of driving the counter circuit.

According to an embodiment of the present invention, there is provided an counter circuit comprising a control unit that outputs a plurality of control signals in response to input of a plurality of counter enable signals, and an operating unit that increments or decrements by 2 or larger in response to the input of the plurality of control signals and count up-down signals.

According to another embodiment of the present invention, there is provided a method of operating the counter circuit comprising: performing a counting up or down operation by 1 using flip-flops that output the remaining digits of the last digit without changing an output value of a flip-flop that outputs the last digit, when performing the counting up or down operation by 2.

BRIEF DESCRIPTION OF THE DRAWINGS

FIG. 4 is a diagram illustrating an operation of the counter circuit according to an embodiment of the present invention.

DESCRIPTION OF EXEMPLARY EMBODIMENT

Hereinafter, preferred embodiments of this invention will be described in detail with reference to accompanying drawings.

Figure 1:
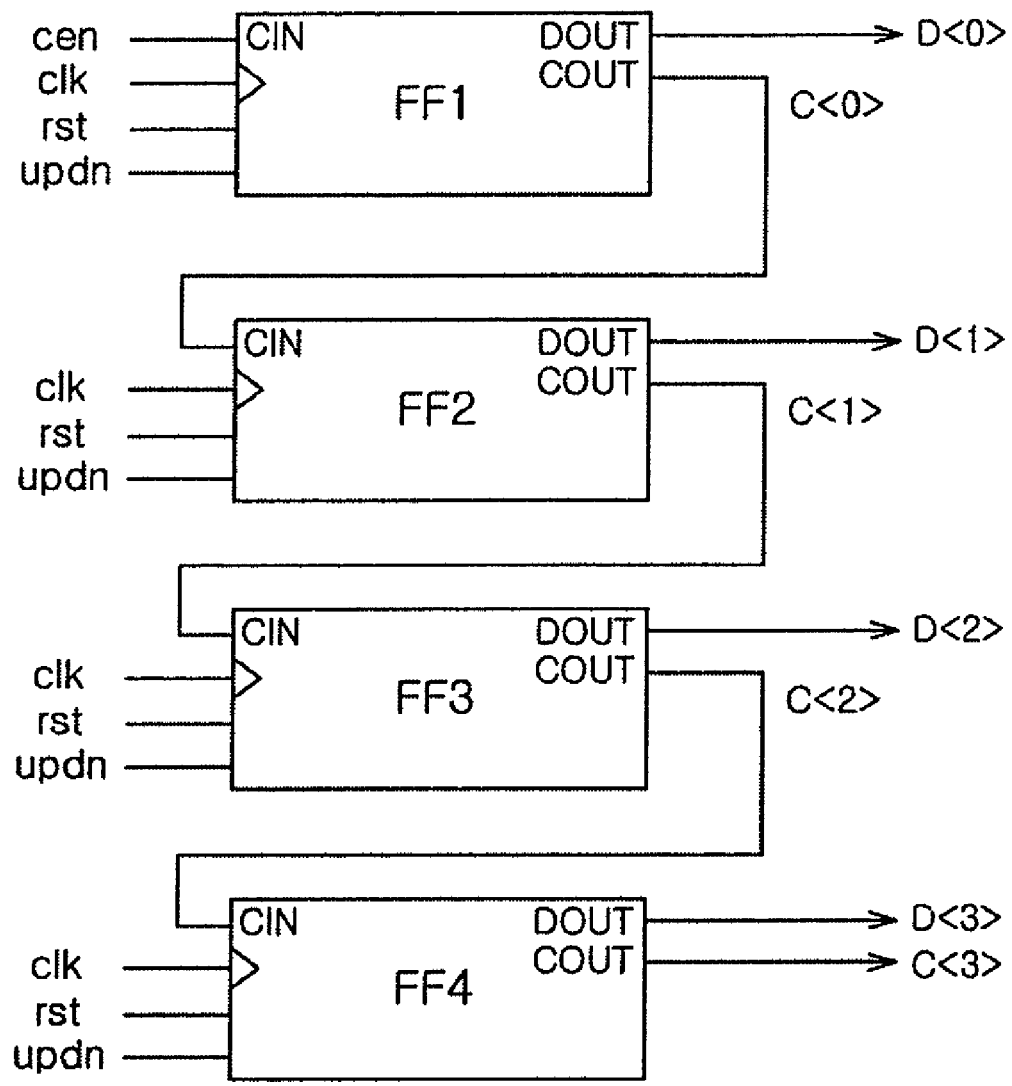
FIG. 1 is a block diagram showing a conventional counter circuit.

As shown in FIG. 1, a counter circuit that outputs a 5-digit binary number is configured by first to fourth flip-flops FF1, FF2, FF3, and FF4 connected in series to each other.

Each of the flip-flops FF1, FF2, FF3, and FF4 receives a clock signal clk, a reset signal rst, and a count up-down signal updn, and performs a data output operation DOUT and a carry output operation COUT by performing an operation on a signal that is input to a carry input terminal CIN.

A counter enable signal cen is input to the carry input terminal CIN of the first flip-flop FF1, and a signal from a carry output terminal COUT of the first flip-flop FF1 is input to the second flip-flop FF2. That is, a signal from a carry output terminal COUT of the previous flip-flop is input to the next flip-flop FF2 to FF4 in series.

When the count up-down signal updn indicates the counting-up operation, the output signal of each of the flip-flops is synchronized with the clock signal clk at a rising edge time of the clock signal clk. Accordingly, if the counter enable signal cen is input to the first flip-flop FF1, the counter circuit starts the counting-up operation. In this case, if the data D<0> that is previously stored in the first flip-flop FF1 is 0, a carry C<0> is not generated, and only the output data is changed from '0' to '1'. Meanwhile, if the data D<0> that is previously stored in the first flip-flop FF1 is 1, a carry C<0> is generated. Thereafter, data D<0> that is to be stored in the first flip-flop FF1 is changed from '1' to '0', and as the carry C<0> is generated, the second flip-flop FF2 is activated to perform the counting-up operation. Therefore, when the counter circuit performs the counting-up operation, the first to fourth flip-flops FF1 to FF4 are activated in accordance with the signals that are input to the carry input terminals CIN to perform the counting-up operation. Further, if the data is changed from '1' to '0', each of the first to fourth flip-flops FF1 to FF4 generates a carry C<i>. As a result, the 5-digit binary numbers output from the counter circuit are determined as a carry 3 C<3>, data 3 D<3>, data 2 D<2>, data 1 D<1>, and data 0 D<0> in this order.

Here, a carry that is generated means the output signal of the carry output terminal COUT of each of the flip-flops is at a high level. Accordingly, a high voltage is input to the carry input terminal CIN of the next flip-flop, and thus the corresponding flip-flop is activated.

In contrast, when a carry is not generated, the output signal of the carry output terminal COUT of each of the flip-flops is at a low level. Accordingly, a low voltage is input to the carry input terminal CIN of the next flip-flop, and thus the corresponding flip-flop is inactivated.

When the count up-down signal updn indicates the counting-down operation, the output signal of each of the flip-flops is synchronized with the clock signal clk at a rising edge time of the clock signal clk. Accordingly, if the counter enable signal cen is input to the first flip-flop FF1, the counter circuit starts the counting-down operation. In this case, the first to fourth flip-flops FF1 to FF4 are activated in accordance with the signals that are input to the carry input terminals CIN to perform the counting-down operation. During the counting-down operation, the first to fourth flip-flops FF1 to FF4 generate carries $C<i>$ when the data is changed from '0' to '1'.

As described above, a typical counter circuit can perform only the counting up or down operation by 1.

Figure 2:
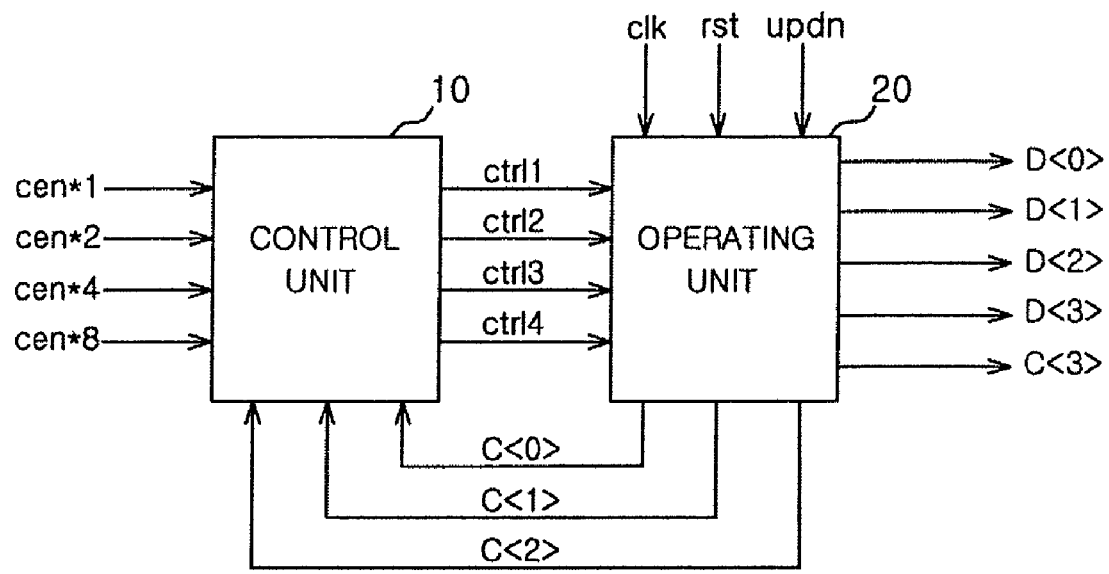
FIG. 2 is a block diagram showing a counter circuit according to an embodiment of the present invention.

A counter circuit according to an embodiment may be configured by a control unit 10 and an operating unit 20 as shown in FIG. 2 so as to perform a counting up or down operation by 2 or larger, preferably, a multiple of 2.

The control unit 10 outputs first to fourth control signals ctrl1 to ctrl4 according to inputs of a counter enable signal by the numerical value of 1 cen*1, a counter enable signal by the numerical value of 2 cen*2, a counter enable signal by the numerical value of 4 cen*4, a counter enable signal by the numerical value of 8 cen*8, and carries 1 to 2 $C<0>$ to $C<2>$.

The operating unit 20 selectively performs a counting-up operation or a counting down operation by a multiple of 2 corresponding to the input of the clock signal clk, the reset signal rst, the first to fourth control signal ctrl1 to ctrl4, and the count up-down signal updn. Further, the operating unit 20 feedbacks the carries 0 to 2 $C<0>$ to $C<2>$ to the control unit 10, and outputs the carry 3 $C<3>$ and data 3 to 0 $D<3>$ to $D<1>$.

When the counter circuit performs the counting up or down operation by 1, the counter enable signal by the numerical value of 1 cen*1 is enabled, and the counter circuit performs a typical counting up or down operation. As the counter enable signal by the numerical value of 1 cen*1 is enabled, the first control signal ctrl1 is enabled, and the second to fourth control signals ctrl2 to ctrl4 are enabled depending on whether the carry 0 $C<0>$ to carry 2 $C<2>$ are generated.

When the counter circuit performs the counting up or down operation by 2, both the counter enable signal by the numerical value of 1 cen*1 and the counter enable signal by the numerical value of 2 cen*2 are enabled. In this case, the first control signal ctrl1 is disabled, the second control signal ctrl2 is enabled, and the third and fourth control signals ctrl3 and ctrl4 are enabled depending on whether the carry 1 $C<1>$ and the carry 2 $C<2>$ are generated.

Similarly, when the counter circuit performs the counting up or down operation by 4, the counter enable signal by the numerical value of 1 cen*1, the counter enable signal by the numerical value of 2 cen*2, and the counter enable signal by the numerical value of 4 cen*4 are enabled. In this case, the first control signal ctrl1 and the second control signal ctrl2 are disabled, the third control signal ctrl3 is enabled, and the fourth control signal ctrl4 is enabled depending on whether the carry 2 $C<2>$ is generated.

When the counter circuit performs the counting up or down operation by 8, all of the counter enable signal by the numerical value of 1 cen*1 to the counter enable signal by the numerical value of 8 cen*8 are enabled. In this case, the first control signal ctrl1 to the third control signal ctrl3 are disabled, and the fourth control signal ctrl4 is enabled.

Thereafter, the operating unit 20 performs the counting up or down operation on the previously stored number depending on whether the first to fourth control signals ctrl1 to ctrl4 and the count up-down signal updn are enabled to output the 5-digit binary number ($C<3>$), ($D<3>$), ($D<2>$), ($D<1>$), and ($D<0>$).

Figure 3:
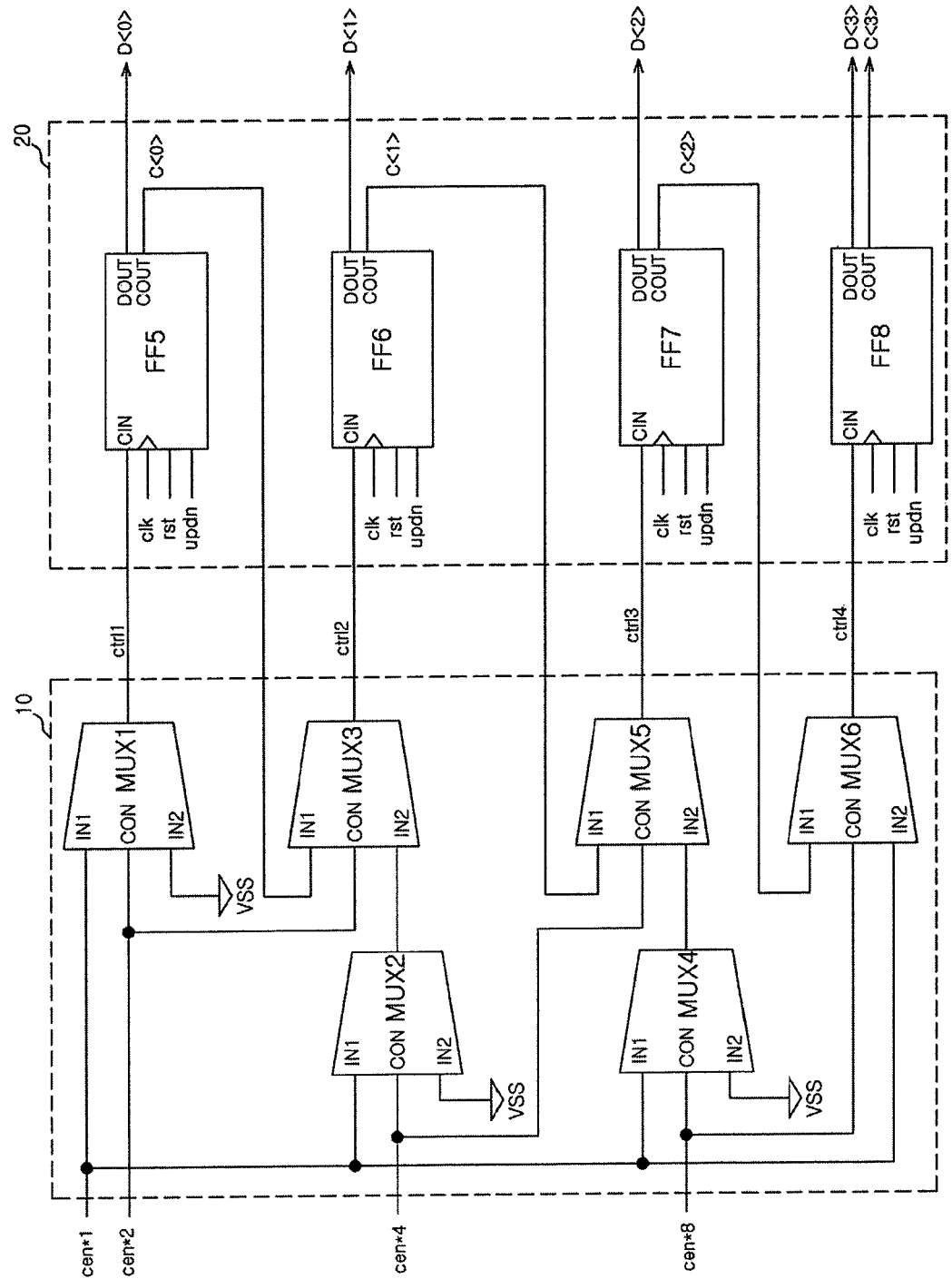
FIG. 3 is a detailed block diagram showing the counter circuit shown in FIG. 2.

Referring to FIG. 3, the control unit 10 includes a first multiplexer MUX1, a second multiplexer MUX2, a third multiplexer MUX3, a fourth multiplexer MUX4, a fifth multiplexer MUX5, and a sixth multiplexer MUX6.

The first multiplexer MUX1 includes a first input terminal IN1 to which the counter enable signal by the numerical value of 1 cen*1 is input and a second input terminal IN2 connected to a ground terminal, and outputs the first control signal ctrl1 in response to the counter enable signal by the numerical value of 2 cen*2 that is input to a control terminal CON.

The second multiplexer MUX2 includes a first input terminal IN1 to which the counter enable signal by the numerical value of 1 cen*1 is input and a second input terminal IN2 connected to a ground terminal, and outputs a signal in response to the counter enable signal by the numerical value of 4 cen*4 that is input to a control terminal CON.

The third multiplexer MUX3 includes a first input terminal IN1 to which a carry 0 $C<0>$ is input and a second input terminal IN2 to which an output signal of the second multiplex MUX2 is input, and outputs the second control signal ctrl2 in response to the counter enable signal by the numerical value of 2 cen*2 that is input to a control terminal CON.

The fourth multiplexer MUX4 includes a first input terminal IN1 to which the counter enable signal by the numerical value of 1 cen*1 is input and a second input terminal IN2 connected to a ground terminal, and outputs a signal in response to the counter enable signal by the numerical value of 8 cen*8 that is input to a control terminal CON.

The fifth multiplexer MUX5 includes a first input terminal IN1 to which a carry 1 $C<1>$ is input and a second input terminal IN2 to which an output signal of the fourth multiplex MUX4 is input, and outputs the third control signal ctrl3 in response to the counter enable signal by the numerical value of 4 cen*4 that is input to a control terminal CON.

The sixth multiplexer MUX6 includes a first input terminal IN1 to which a carry 2 $C<2>$ is input and a second input terminal IN2 to which the counter enable signal by the numerical value of 1 cen*1 is input, and outputs the fourth control signal ctrl4 in response to the counter enable signal by the numerical value of 8 cen*8 that is input to a control terminal CON.

The operating unit 20 may be configured by four flip-flops, for example, fifth to eighth flip-flops FF5 to FF8. Each of the flip-flops FF5 to FF8 receives the clock signal clk, the reset signal rst, and a respective one of the first to fourth control signals ctrl1 to ctrl4 and performs the counting up or down operation with respect to one digit indicated by the count up-down signal updn to output the result to the data output terminal DOUT and the carry output terminal COUT.

Each of the first to sixth multiplexers MUX1 to MUX6 of the control unit 10 outputs a signal of the first input terminal IN1 when the signal that is input to the control terminal CON is at a low level, and outputs a signal of the second input terminal IN2 when the signal input to the control terminal CON is at a high level.

If the counter circuit performs the counting up or down operation by 1, the counter enable signal by the numerical value of 1 cen*1 is enabled, and the counter enable signal by the numerical value of 2 cen*2 to the counter enable signal by the numerical value of 8 cen*8 are disabled. Therefore, the first control signal ctrl1 is enabled. In this case, the operating unit 20 serves as a typical counter circuit. The sixth to eighth flip-flops FF6 to FF8 receive the second to fourth control signals ctrl2 to ctrl4 whose enable states are determined depending on whether a carry is generated in the previous flip-flop at the carry input terminal CIN to perform an operation according to the control signals.

If the counter circuit performs the counting up or down operation by 2, the counter enable signal by the numerical value of 1 cen*1 and the counter enable signal by the numerical value of 2 cen*2 are enabled, and the counter enable signal by the numerical value of 4 cen*4 and the counter enable signal by the numerical value of 8 cen*8 are disabled. Accordingly, the first control signal ctrl1 is disabled, and the second control signal ctrl2 is enabled. The fifth flip-flop FF5 does not change a value of data 0 D<0> that is output if a '0' signal at a ground level is input to the carry input terminal CIN. In this case, the carry 0 C<0> is not generated. The sixth flip-flop FF6 performs the operation when the second control signal ctrl2 is enabled, and the seventh and eighth flip-flops FF7 and FF8 receive the third and fourth control signals ctrl3 and ctrl4 whose enable states are determined depending on whether a carry is generated in the previous flip-flop, through the carry input terminal CIN to perform an operation according to the control signals.

If the counter circuit performs the counting up or down operation by 4, the counter enable signal by the numerical value of 1 cen*1 to the counter enable signal by the numerical value of 4 cen*4 are enabled, and the counter enable signal by the numerical value of 8 cen*8 is disabled. Accordingly, the first and second control signals ctrl1 and ctrl2 are disabled, and the third control signal ctrl3 is enabled. The fifth and sixth flip-flops FF5 and FF6 do not change values of data 0 D<0> and data 1 D<1> that are output when a '0' signal at a ground level is input to the carry input terminal CIN. In this case, the carry 0 C<0> and the carry 1 C<1> are not generated. The seventh flip-flop FF7 performs the operation when the third control signal ctrl3 is enabled, and the eighth flip-flop receives the fourth control signal ctrl4 whose enable state is determined depending on whether the carry C<3> is generated in the seventh flip-flop FF7, through the carry input terminal CIN to perform an operation according to the control signal.

If the counter circuit performs the counting up or down operation by 8, all of the counter enable signal by the numerical value of 1 cen*1 to the counter enable signal by the numerical value of 8 cen*8 are enabled. Accordingly, the first to third control signals ctrl1 to ctrl3 are disabled, and the fourth control signal ctrl4 is enabled. The fifth to seventh flip-flops FF5 to FF7 do not change values of data 0 D<0> to data 2 D<2> that are output when a '0' signal at a ground level is input to the carry input terminal CIN. In this case, the carry 0 C<0> to carry 2 C<2> are not generated. The eighth flip-flop FF8 performs the operation when the fourth control signal ctrl4 is enabled.

As described above, the counter circuit according to an embodiment of the present invention selectively actives the flip-flops in order to perform the counting up or down operation by a multiple of 2. During the counting up or down operation by a multiple of 2, data of the last digit is not changed, but data of the remaining digits is incremented or decremented by 1. Further, during the counting up or down operation by 4, data of the last digit and the digit before the last digit thereof are not changed, but data of the remaining digits is incremented or decremented by 1. Furthermore, during the counting up or down operation by 8, data of the last digit, the digit before the last digit, and the second digit from the last digit are not changed, but data of the remaining digits is incremented or decremented by 1. By means of the above operation, the counter circuit according to an embodiment can perform the counting up or down operation by a multiple of 2.

FIG. 4 is a diagram illustrating an operation of the counter circuit according to an embodiment of the present invention.

Referring to FIG. 4, changes in data in the counting up or down operations with the numerical value of 1, 2, 4, and 8 are sequentially shown. In here, the carry 3 C<3> is not shown.

Referring to FIG. 4, it is understood that if the initial value of the data 0 D<0> is '0' in the counting up or down operation by 2, the counting up or down operation by 1 is performed with respect to the remaining data while data 0 D<0> remains at '0'. Further, it is understood that if the initial value of the data 0 D<0> and the data 1 D<1> is '0' in the counting up or down operation by 4, the counting up or down operation by 1 is performed with respect to the remaining data while data 0 D<0> and data 1 D<1> remains at '0'. Furthermore, it is understood that if the initial value of the data 0 D<0> to 2 D<2> is '0' in the counting up or down operation by 8, the counting up or down operation by 1 is performed with respect to the data 3 D<3> while data 0 D<0> to 2 D<2> remain at '0'.

By using the above principle, the counter circuit according to an embodiment selectively performs the counting up or down operation by a multiple of 2. Therefore, when the counter circuit repeatedly performs the counting up or down operation by a relatively large number, the counting up or down operations by 1 to 8 are selectively performed, which can reduce the time for the operation and increase the time efficiency of the operation.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A counter circuit comprising:
 a first flip-flop that is inactive when any one of a counter enable signal by the numerical value of 2, a counter enable signal by the numerical value of 4, and a counter enable signal by the numerical value of 8 is enabled;
 a second flip-flop that is inactive when the counter enable signal by the numerical value of 4 or the counter enable signal by the numerical value of 8 is enabled;
 a third flip-flop that is inactive when the counter enable signal by the numerical value of 8 is enabled; and
 a control unit that generates first to third control signals that activate the first to third flip-flops in response to the counter enable signal by the numerical value of 2, the counter enable signal by the numerical value of 4, and the counter enable signal by the numerical value of 8 and carries transmitted from the first and second flop-flops, wherein the control unit includes:
  a first multiplexer that includes a first input terminal to which the counter enable signal by the numerical value of 1 is input, a second input terminal connected to a ground terminal, and a control terminal to which the counter enable signal by the numerical value of 2 is input and that outputs the first control signal in response to the counter enable signal by the numerical value of 2,
  a second multiplexer that includes a first input terminal to which the counter enable signal by the numerical value of 1 is input, a second input terminal connected to the ground terminal, and a control terminal to which the counter enable signal by the numerical value of 4 is input, and that outputs a signal in response to the counter enable signal by the numerical value of 4, a third multiplexer that includes a first input terminal to which a carry of a last digit is input, a second input terminal to which the signal output of the second multiplexer is input, and a control terminal to which the counter enable signal by the numerical value of 2 is input, and that outputs the second control signal in response to the counter enable signal by the numerical value of 2, a fourth multiplexer that includes a first input terminal to which the counter enable signal by the numerical value of 1 is input, a second input terminal connected to the ground terminal, and a control terminal to which the counter enable signal by the numerical value of 8 is input, and that outputs a signal in response to the counter enable signal by the numerical value of 8, and a fifth multiplexer that includes a first input terminal to which a carry of a digit before the last digit is input, a second input terminal to which the signal output of the fourth multiplexer is input, and a control terminal to which the counter enable signal by the numerical value of 4 is input, and that outputs the third control signal in response to the counter enable signal by the numerical value of 4.

2. The counter circuit of claim 1, wherein among the first to third flip-flops, an inactive flip-flop does not change output data, but at least one of active flop-flops performs a counting up or down operation by 1.

3. The counter circuit of claim 1, wherein each of the first to fifth multiplexers selectively outputs the signal input to its respective first or second input terminals, on the basis of an input to the control terminal.

\* \* \* \* \*